United States Patent
Logiudice et al.

(10) Patent No.: US 9,148,923 B2
(45) Date of Patent: Sep. 29, 2015

(54) DEVICE HAVING A PLURALITY OF DRIVER CIRCUITS TO PROVIDE A CURRENT TO A PLURALITY OF LOADS AND METHOD OF MANUFACTURING THE SAME

(71) Applicant: Infineon Technologies AG, Neubiberg (DE)

(72) Inventors: Andrea Logiudice, Padua (IT); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 14/138,328

(22) Filed: Dec. 23, 2013

(65) Prior Publication Data

US 2015/0181658 A1   Jun. 25, 2015

(51) Int. Cl.
*H01L 29/66* (2006.01)
*H05B 33/08* (2006.01)
*H05B 37/03* (2006.01)

(52) U.S. Cl.
CPC .............. *H05B 33/083* (2013.01); *H05B 37/03* (2013.01)

(58) Field of Classification Search
CPC ............... H01L 21/76898; H01L 2224/48247; H01L 2924/00014; H01L 2224/48137
USPC .................. 257/330, 335, 355, 329, E29.262, 257/E21.41, E21.51; 438/424, 435, 589, 438/430, 268
See application file for complete search history.

(56) References Cited

U.S. PATENT DOCUMENTS

| | | | | |
|---|---|---|---|---|
| 6,034,561 | A * | 3/2000 | Dikeman et al. | 327/439 |
| 6,434,016 | B2 * | 8/2002 | Zeng et al. | 361/760 |
| 7,829,940 | B2 * | 11/2010 | Hirler et al. | 257/329 |
| 8,344,512 | B2 * | 1/2013 | Knickerbocker | 257/773 |
| 8,618,651 | B1 * | 12/2013 | Yee | 257/698 |
| 8,674,470 | B1 * | 3/2014 | Or-Bach et al. | 257/499 |
| 2004/0157407 | A1 * | 8/2004 | Tong et al. | 438/455 |
| 2010/0264508 | A1 * | 10/2010 | Stecher et al. | 257/503 |
| 2012/0146130 | A1 | 6/2012 | Hirler et al. | |
| 2012/0146133 | A1 | 6/2012 | Hirler et al. | |
| 2014/0049293 | A1 * | 2/2014 | Mallikarjunaswamy | 327/108 |
| 2014/0334522 | A1 * | 11/2014 | Meiser et al. | 374/178 |

\* cited by examiner

*Primary Examiner* — Yosef Gebreyesus
(74) *Attorney, Agent, or Firm* — Shumaker & Sieffert, P.A.

(57) ABSTRACT

In various embodiments, a device is provided. The device includes a substrate having a first side and a second side opposite the first side. The substrate includes a plurality of driver circuits at the first side of the substrate. Each of the plurality of driver circuits is configured to drive a current from the first side of the substrate to the second side of the substrate. The device further includes at least one load interface at the second side of the substrate. The at least one load interface is configured to couple the current from the plurality of the driver circuits to a plurality of loads at the second side of the substrate.

19 Claims, 9 Drawing Sheets

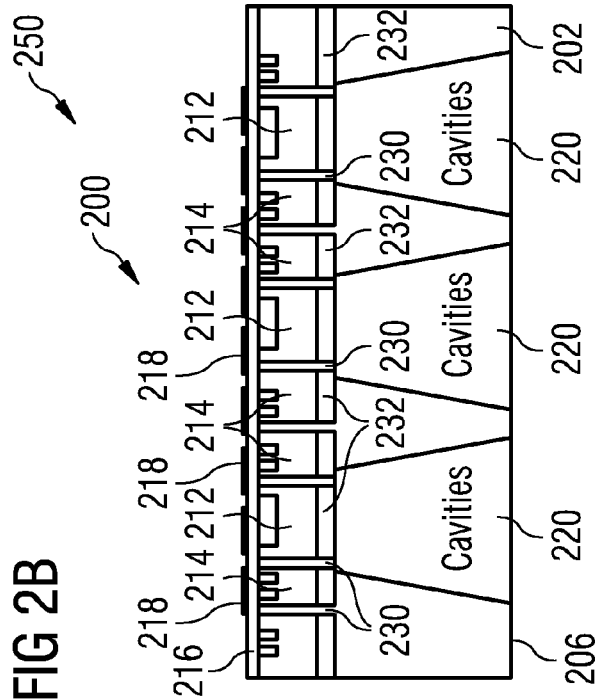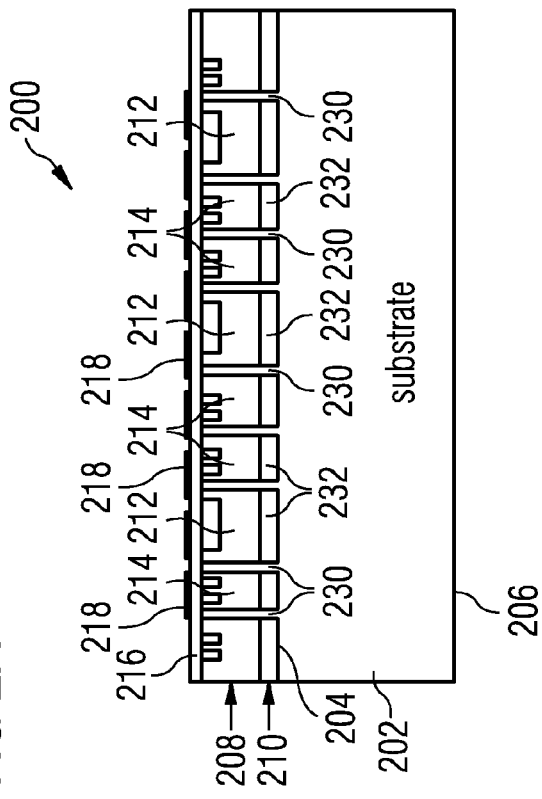

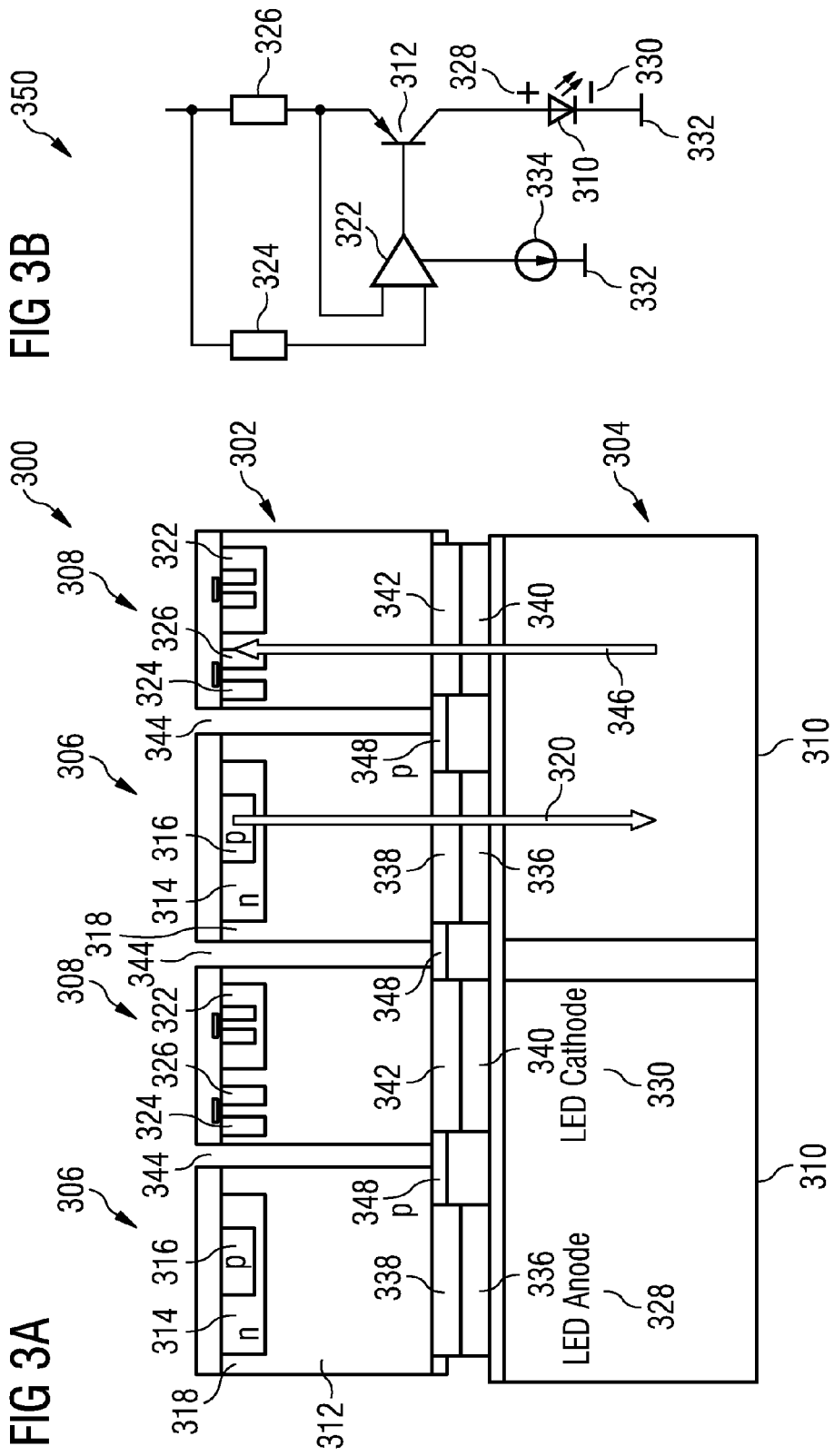

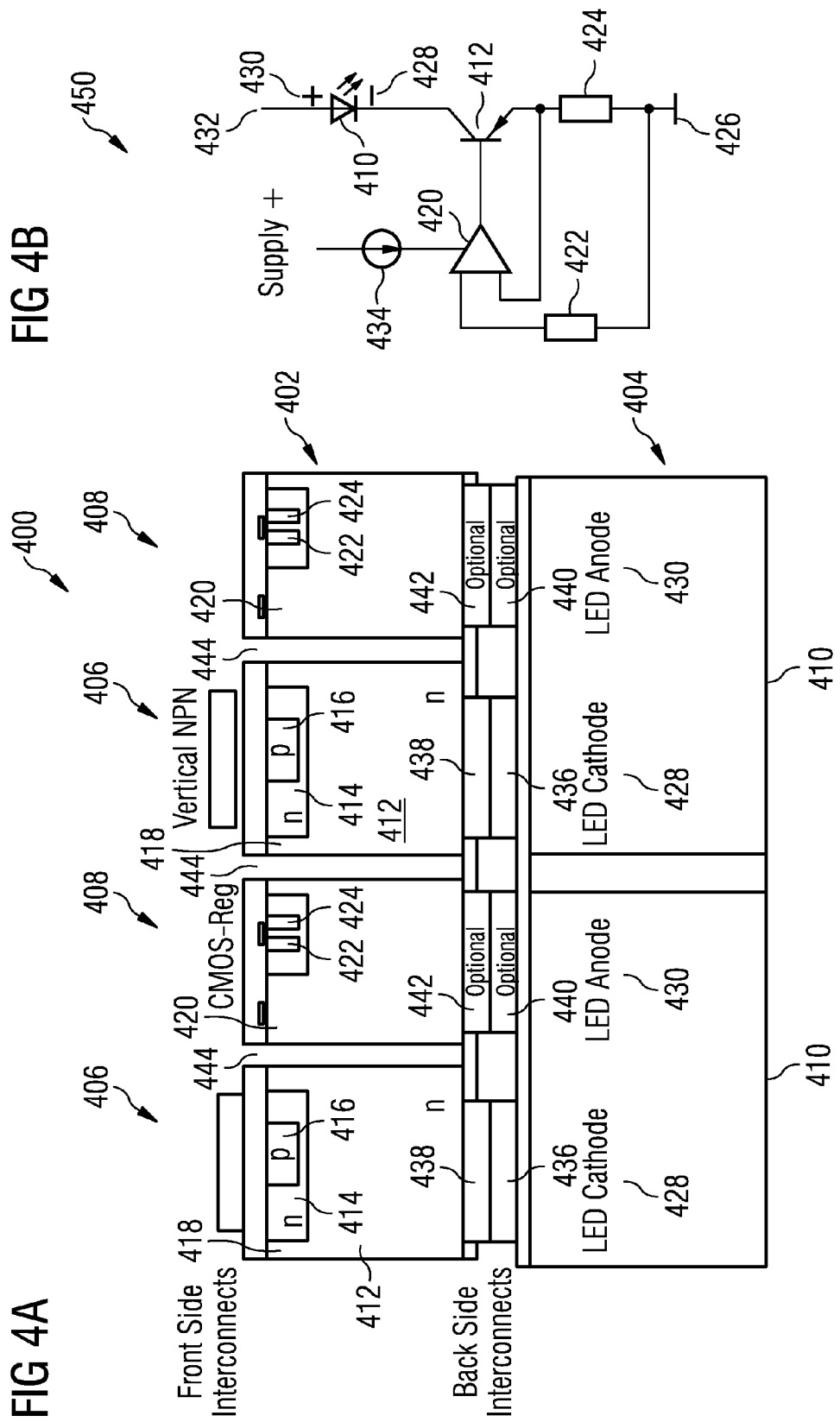

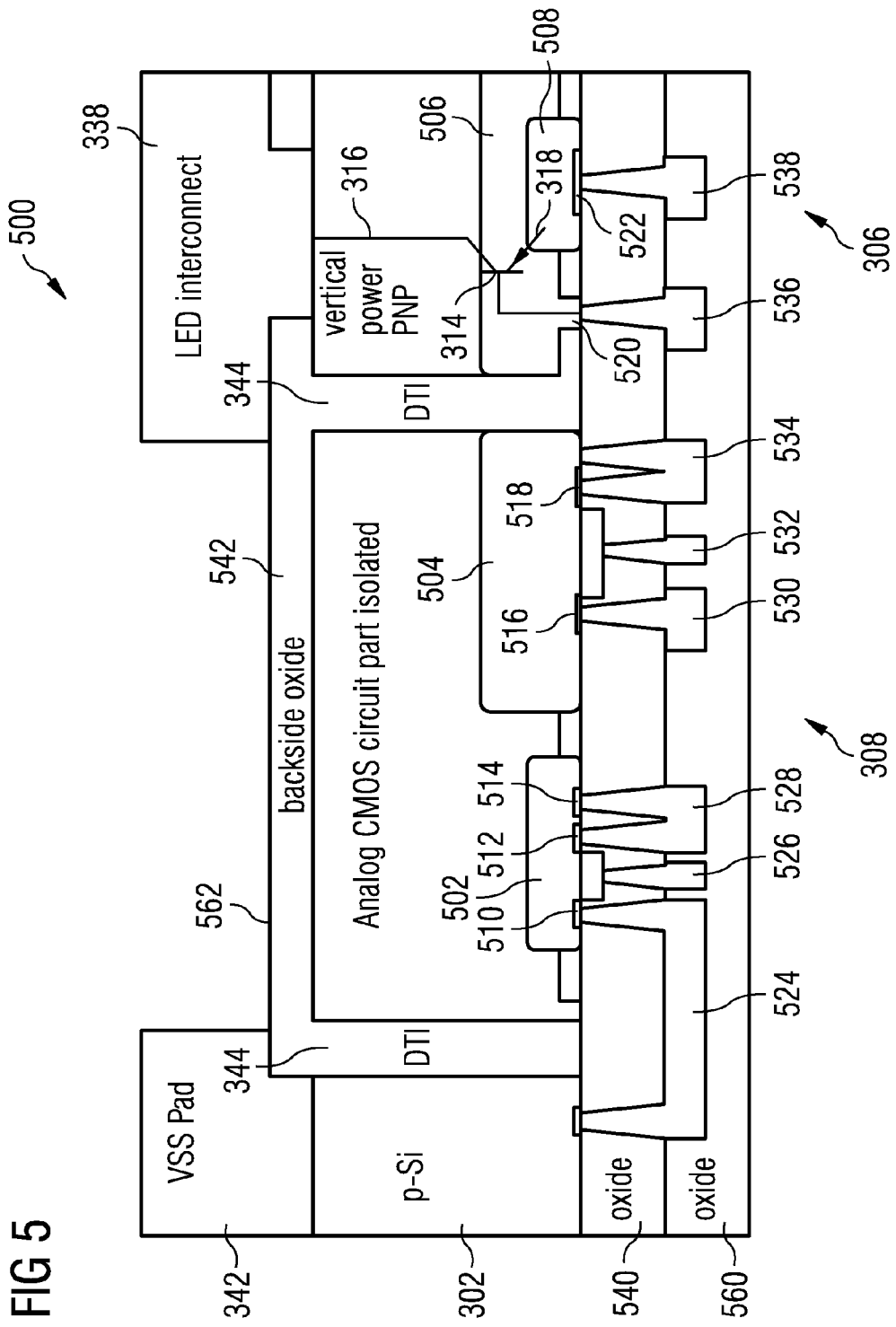

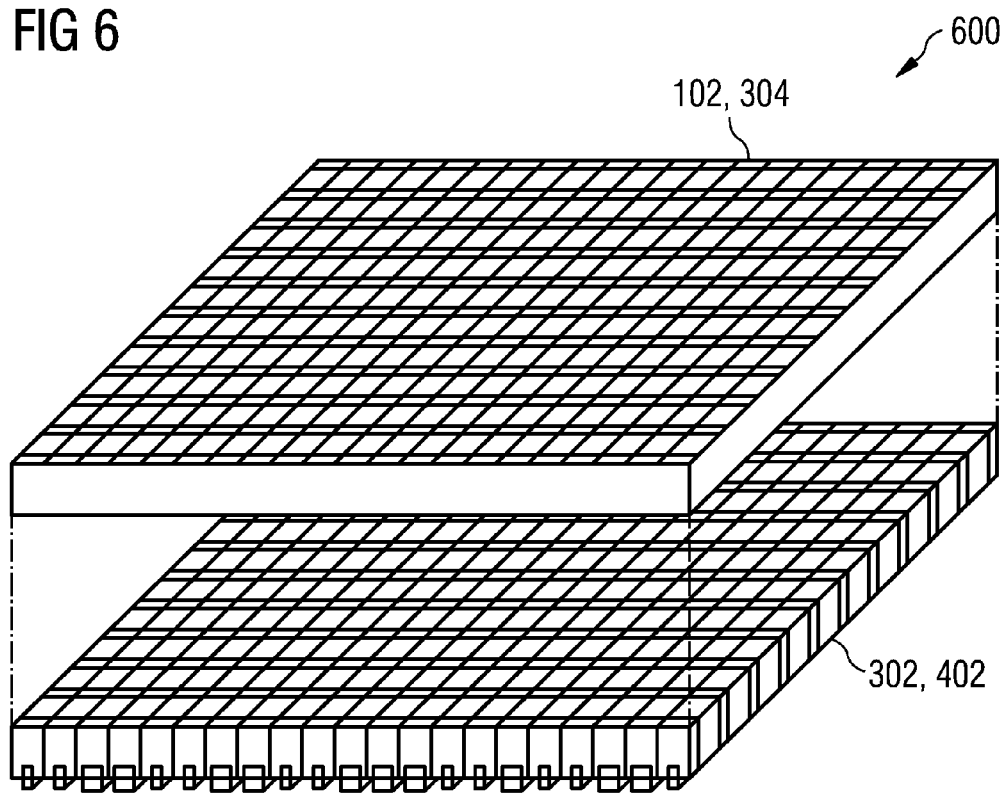

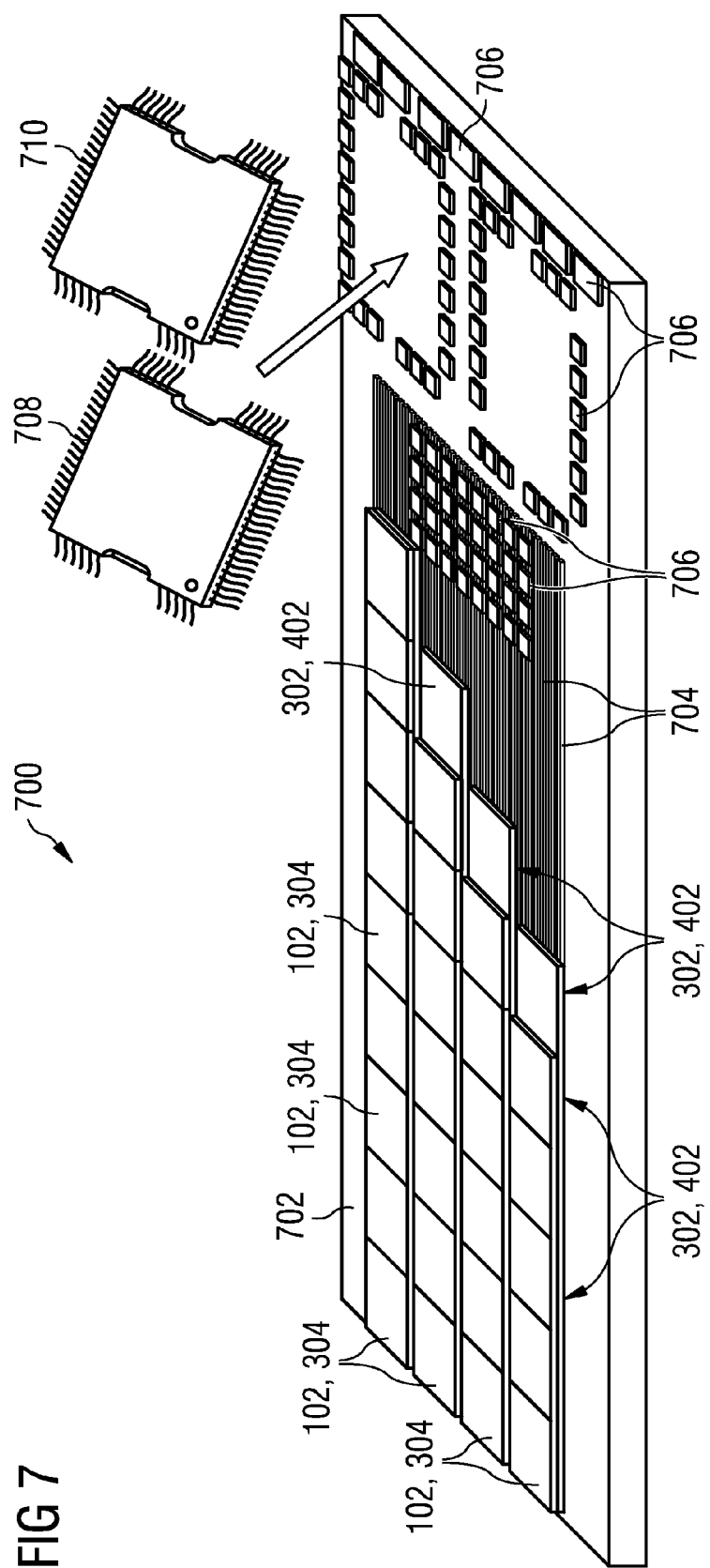

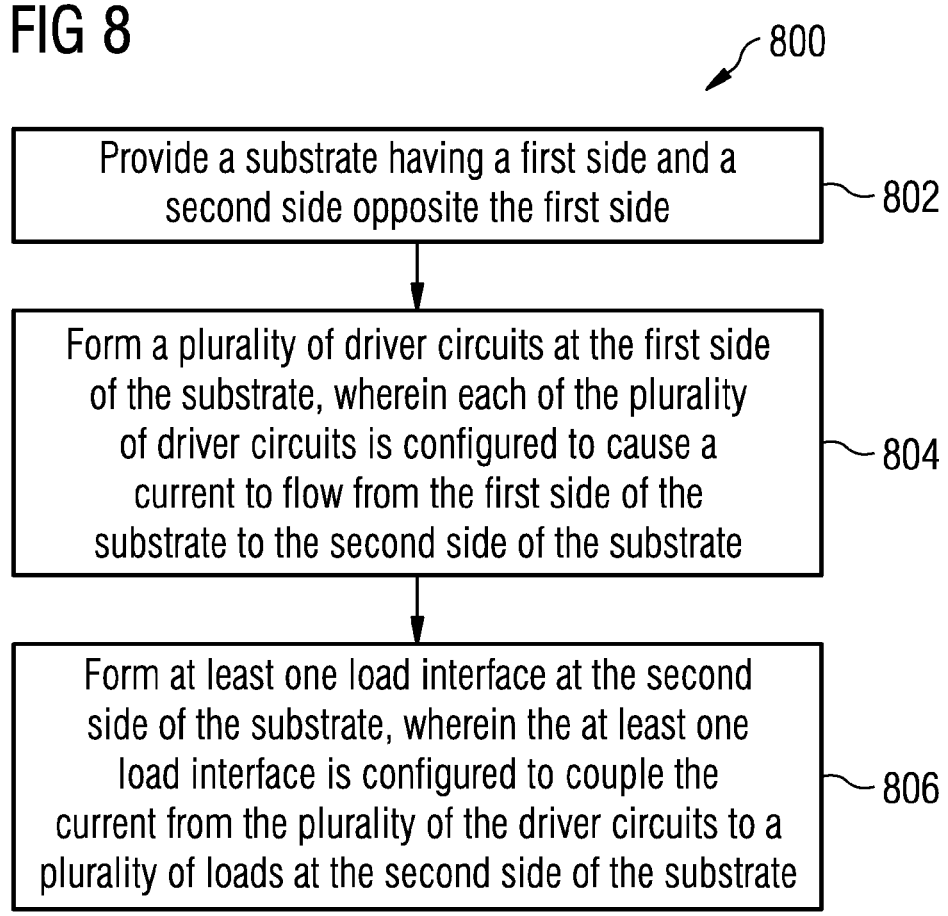
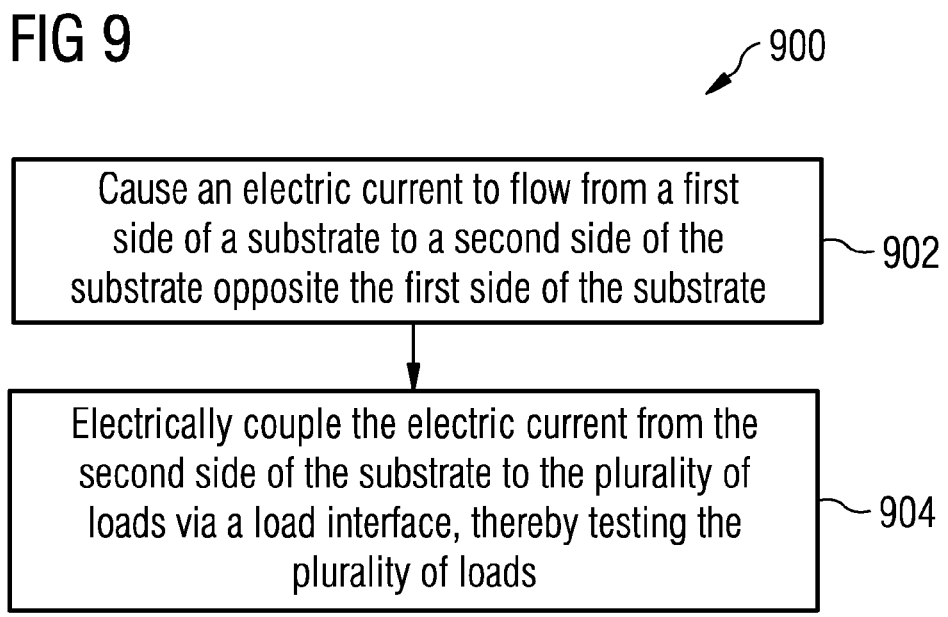

DEVICE HAVING A PLURALITY OF DRIVER CIRCUITS TO PROVIDE A CURRENT TO A PLURALITY OF LOADS AND METHOD OF MANUFACTURING THE SAME

TECHNICAL FIELD

Various embodiments relate generally to a device having a plurality of driver circuits to provide a current to a plurality of loads and to a method of manufacturing the device.

BACKGROUND

In order to provide large displays, a large number of hundreds or thousands light emitting structures such as light emitting diodes are nowadays provided in a display matrix. In order to operate such a display, one or more driver circuits are usually provided to drive the light emitting structures. With an increasing number of light emitting structures, it becomes more and more demanding to interconnect the light emitting structures with the one or more driver circuits to provide a reliable operation of the display matrix.

In a conventional display matrix, the one or more driver circuits are arranged underneath the light emitting structures. But with an increase of the surface size of the display matrix (which may be up to or even larger than 240 mm$^2$) based on a silicon substrate, such an arrangement nowadays leads to an insufficient yield. Furthermore, it becomes more and more difficult to test the one or more driver circuits.

SUMMARY

In various embodiments, a device is provided. The device includes a substrate having a first side and a second side opposite the first side. The substrate includes a plurality of driver circuits at the first side of the substrate. Each of the plurality of driver circuits is configured to drive a current from the first side of the substrate to the second side of the substrate. The device further includes at least one load interface at the second side of the substrate. The at least one load interface is configured to couple the current from the plurality of the driver circuits to a plurality of loads at the second side of the substrate.

Furthermore, in various embodiments, a method of manufacturing a device is described herein. The method includes providing a substrate having a first side and a second side opposite the first side and forming a plurality of driver circuits at the first side of the substrate. Each of the plurality of driver circuits is configured to drive a current from the first side of the substrate to the second side of the substrate. Furthermore, the method includes forming at least one load interface at the second side of the substrate. The at least one load interface is configured to couple the current from the plurality of the driver circuits to a plurality of loads at the second side of the substrate.

In various embodiments, a method for testing a plurality of loads is provided. The method includes driving, by a plurality of driver circuits embedded in a first side of a substrate, an electric current from the first side of a substrate to a second side of the substrate opposite the first side of the substrate; and electrically coupling, via at least one load interface at the second side of the substrate, the electric current from the plurality of driver circuits to a plurality of loads at the second side of the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2D show cross sectional views illustrating a manufacturing of a driver substrate to receive LED sub-matrices of FIG. 1A and FIG. 1B; and FIG. 3A shows a cross sectional view of a portion of a driver substrate and a portion of an LED sub-matrix in accordance with various embodiments;

FIG. 3B shows a circuit diagram of a circuit including an LED and a driver circuit as implemented by a portion as shown in FIG. 3A;

FIG. 4A shows a cross sectional view of a portion of a driver substrate and a portion of an LED sub-matrix in accordance with various embodiments;

FIG. 4B shows a circuit diagram of a circuit including an LED and a driver circuit as implemented by a portion as shown in FIG. 3A;

FIG. 5 shows an enlarged cross sectional view of a portion of a driver substrate as shown in FIG. 3A;

FIG. 6 shows an LED sub-matrix and a corresponding portion of a driver substrate in accordance with various embodiments;

FIG. 7 shows a plurality of LED sub-matrices and a corresponding portions of the driver substrates as shown in FIG. 6 being mounted on a carrier in accordance with various embodiments;

FIG. 8 shows a flow diagram illustrating a method of manufacturing a device; and FIG. 9 shows a flow diagram illustrating a method for testing a plurality of loads.

DESCRIPTION

Figure 1A:
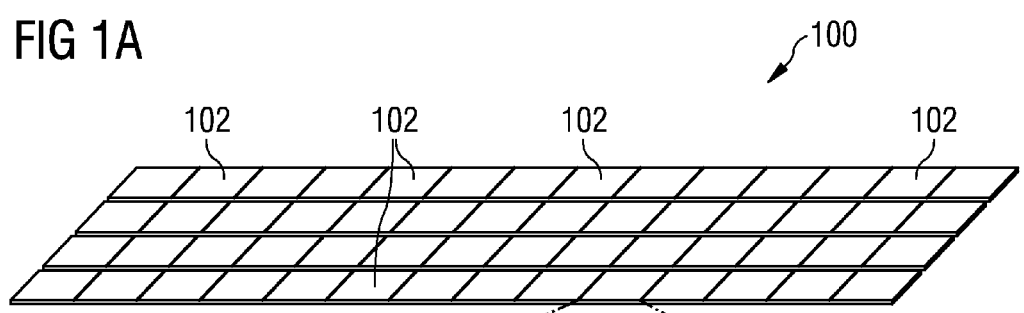
FIG. 1A shows a light emitting diode matrix in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

As will be described in more detail below, a device is provided which will simplify the testing of a high number of light emitting structures such as e.g. a high number of light emitting diodes. By way of example, by arranging one or more driver circuits and at least one load interface (and thus, if connected, the plurality of loads) on opposite sides of a substrate, the arrangement of the driver circuits and the at least one load interface is improved with respect to the required surface area of the substrate. Furthermore, the driver circuits can be accessed in an easier manner, since they are freely accessible from one side of the substrate. This will simplify the testing of the driver circuits. Moreover, the more relaxed structure with respect to the resolution of the driver circuits as well as the loads (e.g. light emitting structures such as e.g. light emitting diodes (LEDs)) may achieve an improved yield. In other words, in various embodiments, a more reliable interconnect structure is provided to connect driver circuits with a large number of loads such as e.g. a large number of light emitting structures such as e.g. LEDs. In general, various embodiments enable a simplification of testing of a plurality of LEDs, e.g. of a high number of LEDs which may be arranged in a large LED matrix.

In various embodiments, illustratively, a driver technology is provided, according to which one or more driver circuits are provided on or in a substrate. The one or more driver circuits provide an electrical current flow through the substrate from a first side of the substrate to a second side of the substrate, wherein the first side of the substrate and the second side of the substrate are opposite to each other. On the side of the substrate opposite the side at which the one or more driver circuits are provided, one or more load interfaces are formed. The one or more load interfaces may couple the current flowing through the substrate (in other words in this case through the body of the substrate) to a plurality of loads, which may be arranged at the second side of the substrate. Thus, illustratively, a vertical current flow through the substrate may be provided.

As will be described in more detail below, in various embodiments, the driver circuits may be interconnected on one side of the substrate with one or more loads (e.g. one or more LEDs) and on the other side with an adequate lattice containing a wiring which may be provided to access each single load (e.g. each single LED). In various embodiments, the loads may include sensors and/or actuators of any desired type, if desired in the same matrix or sub-matrix.

Although in the following, various embodiments will be described using light emitting structures such as light emitting diodes as one example of loads, it is to be noted that the embodiments are not limited to those. In various embodiments, the loads may include or be sensors and/or actuating structures which should be arranged in a dense matrix arrangement.

As will be outlined in more detail below, various embodiments illustratively provide a modular construction system including, on the one hand, a substrate including a plurality of monolithically integrated (in other words embedded) circuits such as e.g. driver circuits including one or more transistors (e.g. power transistors) and a logic circuit, e.g. including a regulating circuit, and on the other hand a plurality of LED sub-matrices, each including a plurality of LEDs, wherein the LEDs may be respectively associated with (e.g. each LED may be received in a respective recess in the substrate) a respective driver circuit, for example.

In various embodiments, a suitable driver and interconnection technology is provided.

Figure 1B:
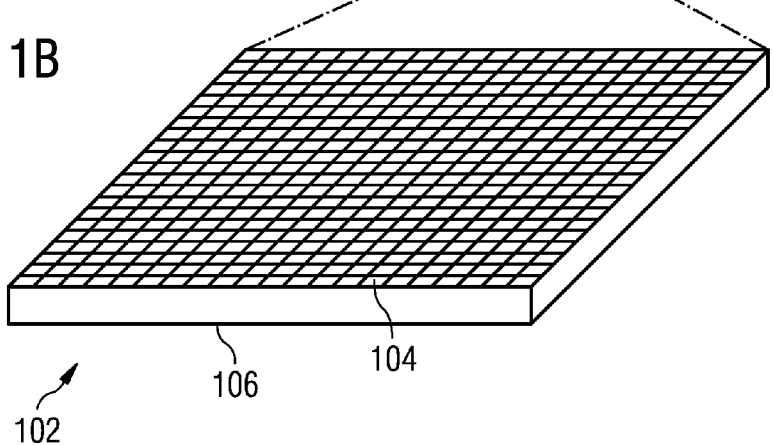
FIG. 1B shows a light emitting diode sub-matrix being a part of the light emitting diode matrix of FIG. 1A.

FIG. 1A shows a light emitting diode matrix 100 in accordance with various embodiments. The light emitting diode matrix (in the following also referred to as LED matrix) 100 may include or be formed by a plurality of light emitting diode sub-matrices (in the following also referred to as LED sub-matrices) 102. FIG. 1B shows an enlarged view of one of the plurality of LED sub-matrices 102. Each LED sub-matrix 102 may include a plurality of pixels (each pixel may include one or more LEDs) 104 formed in or over an LED sub-matrix substrate 106. It is to be noted, however, that the dividing of the LED matrix 100 into a plurality of LED sub-matrices 102 is optional. In various embodiments, each pixel 104 may have a footprint in the range from about 10 µm*10 µm to about 1000 µm*1000 µm, e.g. in the range from about 50 µm*50 µm to about 500 µm*500 µm, e.g. of about 100 µm*100 µm. However, other sizes of the footprint of each pixel 104 may be provided in various embodiments. Further, the pixels 104 do not need to have a square footprint but may also have a rectangular or other polygonial or even round (e.g. circular or elliptical) footprint. Moreover, it is to be noted that the pixels 104 may be arranged in rows and columns, however, this is optional; the pixels 104 may be arranged in general in an arbitrary manner, regularly or irregularly. In various embodiments, each LED sub-matrix 102 may include n*m pixels 104 (with n being e.g. in the range from 2 to 100, e.g. in the range from 5 to 50, e.g. in the range from 10 to 30, e.g. about 20; and with m being e.g. in the range from 2 to 100, e.g. in the range from 5 to 50, e.g. in the range from 10 to 30, e.g. about 20; wherein n and m may be the same number or may be different numbers). In various embodiments, each LED sub-matrix 102 may include 20*20 pixels 104. In various embodiments, each LED sub-matrix 102 may have a size in the range from about 2 mm*2 mm to about 3 mm*3 mm, e.g. of about 2 mm*2 mm. However, other sizes of the LED sub-matrices 102 may be provided in various embodiments. Further, the LED sub-matrices 102 do not need to have a square footprint but may also have a rectangular or other polygonial or even round (e.g. circular or elliptical) footprint. In various embodiments, the LED matrix 100 may include hundreds or thousands of pixels 104, e.g. several tens of thousands of pixels 104, e.g. in the range from about 20,000 pixels to about 30,000 pixels, e.g. about 24,000 pixels.

FIGS. 2A to 2D show cross sectional views illustrating a manufacturing of a driver substrate to receive LED sub-matrices of FIG. 1A and FIG. 1B. The embodiments as shown in FIGS. 2A to 2D illustratively provide a micro structuring of the semiconductor substrate of the driver circuit and of the LEDs.

FIG. 2A shows a first structure 200 including a substrate 202 having a first side 204 and a second side 206 opposite the first side 204. The substrate 202 may include a semiconductor material, e.g. silicon or silicon germanium, or semiconductor compound material (e.g. III-V semiconductor compound material or II-VI semiconductor compound material) such as e.g. indium phosphorous (InP) or gallium arsenide (GaAs), or the like, which may be doped with doping atoms, e.g. with p-type doping atoms such as e.g. boron (B). Any other suitable semiconductor material or dopant may be provided in various embodiments. The substrate 202 may include a silicon full body wafer or a silicon on insulator (SOI) wafer.

Furthermore, an epitaxial layer 208, e.g. an epitaxial silicon layer 208, may be deposited over, e.g. grown on the substrate 202. The epitaxial layer 208 may be doped with doping atoms, e.g. with n-type doping atoms (n) such as e.g. phosphorous (P) or the like.

Moreover, a buried electrically conductive structure 210 which may form e.g. a buried bitline 210, may be provided to provide electric current to electronic components as will be described in more detail below. The buried electrically conductive structure 210 may be highly doped with doping atoms, e.g. with n-type doping atoms (n+) such as e.g. phosphorous (P) or the like. In various embodiments, the buried electrically conductive structure 210 may be formed within the epitaxial layer 208 at the interface to the substrate 202. Various portions of the buried electrically conductive structure 210 on the first side 204 may provide an electrical contact 232 between e.g. the material of the buried electrically conductive structure 210 (e.g. silicon) and an electrode of a load, e.g. of a light emitting diode, as will be described in more detail below.

In various embodiments, one or more electronic components may be formed in the epitaxial layer 208 and may be electrically conductively connected to the buried electrically conductive structure 210.

To implement the one or more electronic components, depending on the type of component, one or more wells may be provided in the epitaxial layer 208 as well as various active regions or various diffusion regions to form e.g. one or more transistors such as one or more field effect transistors (FET) (such as e.g. metal oxide semiconductor (MOS) FET, e.g. complementary MOSFET (CMOSFET) or double-diffused MOSFET (DMOSFET)) or one or more bipolar transistors or one or more insulated gate bipolar transistors (IGBT) and the like. The one or more transistors may be configured as one or more power transistors.

In various embodiments, any kind of logic circuit (e.g. one or more driver circuits) may be provided. In various embodiments, the electronic components may include planar components and/or vertical components.

A plurality of individual component regions may be provided in the epitaxial layer 208, which may be laterally isolated from each other. By way of example, a first component region 212 may include one or more (e.g. vertical) power transistors (which may be used as power switch in a driver circuit). Furthermore, a second component region 214 may include logic components, e.g. implementing a (e.g. CMOS) regulator circuit controlling the power transistor(s) in the first component region 212. In various embodiments, the individual component regions 212, 214 may be laterally isolated from each other by means of shallow trench isolations structures (STI) 230 or by means junction isolation structures 230, wherein each of them may be provided between respective two individual component regions 212, 214. Thus, the individual component regions 212, 214 are prevented from being electrically shorted.

Moreover, a passivation layer (e.g. silicon oxide or silicon nitride) 216 may be deposited over the epitaxial layer 208 and may include openings for contact pad structures 218 to electrically conductively contact the electronic components in the epitaxial layer 208. Furthermore, the electronic component(s) in the first component region 212 may be electrically conductively connected to one or more electronic components in the second component region 214 via the contact pad structures 218. Thus, the upper surface of the epitaxial layer 208 (e.g. the upper surface of the epitaxial silicon layer 208) may be in direct physical contact with the lower surface of the passivation layer 216.

Illustratively, a plurality of driver circuits may be provided at the first side 204 of the substrate 202, wherein each of the plurality of driver circuits is configured to drive a current from the first side 204 of the substrate 202 to the second side 206 of the substrate 202.

FIG. 2B shows a second structure 250, in which a plurality of cavities (in other words recesses) 220 may be formed from in the substrate 202 from the second side 206 of the substrate 202 to expose at least a portion of the buried electrically conductive structure 210 or of the epitaxial layer 208. The plurality of cavities 220 may be formed by means of removing material of the substrate 202, e.g. by means of etching (e.g. wet etching or dry etching). In various embodiments, at least a portion of the buried electrically conductive structure 210 or of the epitaxial layer 208 of the first component region 212 may be exposed to allow a later electrical contact with the at least one electronic component (e.g. the power transistor) provided in the first component region 212.

Figure 2C:
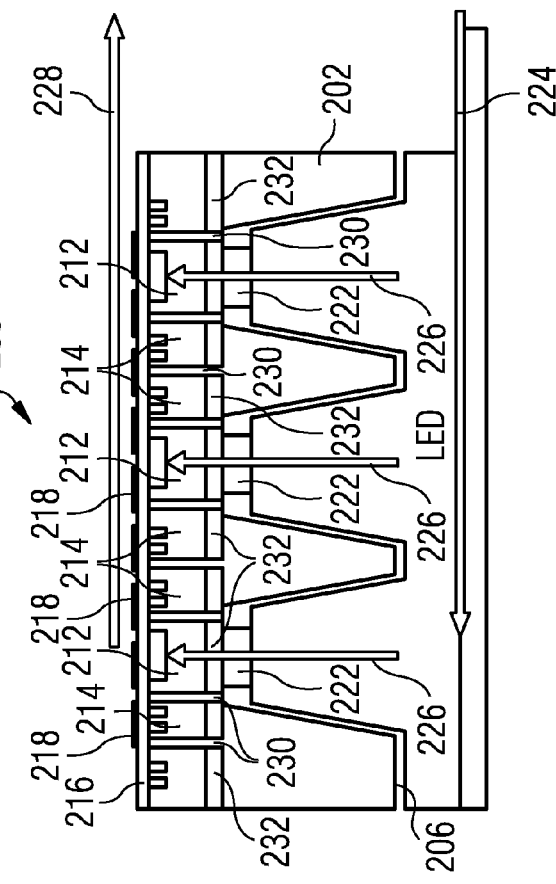

Then, as shown in a third structure 260 in FIG. 2C, solder 222 or conductive glue 222 may be provided at each bottom of the cavities 220 on the buried electrically conductive structure 210, for example, to fix the LEDs of the LED sub-matrix 102 as will described in more detail below. Illustratively, the buried electrically conductive structure 210 may provide a load interface to couple current from the plurality of the integrated circuits (e.g. driver circuits) to a plurality of loads. One example of a load is a light emitting device such as an LED, however, any other load consuming electric current may be provided such as a sensor component and the like.

Figure 2D:
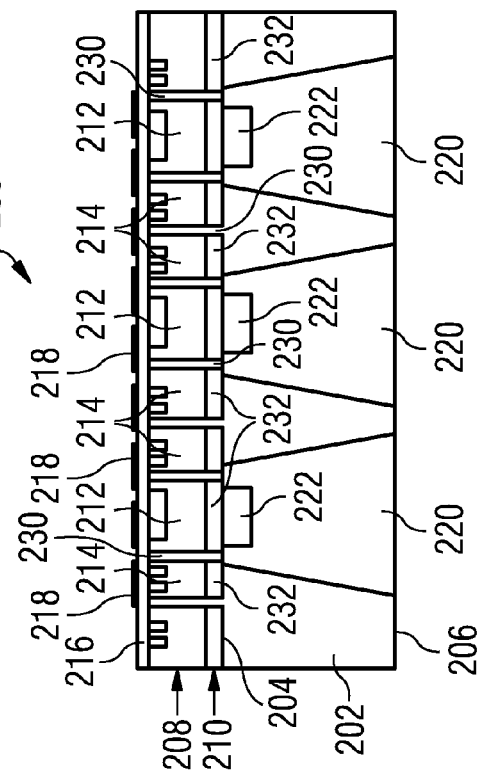

Further, as shown in FIG. 2D, the individual LEDs of the LED sub-matrix 102 are brought into the cavities (exactly one LED may be brought into each cavity 220) and may be fixed by the solder 222 (in this case by soldering) or the conductive glue 222 (in this case by adhering). Thus, a mechanical fixation as well as an electrically conductive connection is provided between the LEDs of the LED sub-matrix 102 and the electronic component e.g. the transistor in the first component region 212. Thus, a current flow may be provided through the LED sub-matrix 102 (lateral current flow symbolized by means of a first arrow 224), through a respective LED (vertical current flow symbolized by means of a second arrow 226) and through the contact pad structures 218 (lateral current flow symbolized by means of a third arrow 228).

Illustratively, in various embodiments as described above, a plurality of cavities 220 are created from the second side 206 of the substrate 202 and electrically contact the buried electrically conductive structure 210. The LEDs (each electrode may have two electrodes) may have a shape compatible to a respective cavity 220, and have at least one electrode to be contacted with the buried electrically conductive structure 210. Alternatively, both electrodes of the LEDs may be placed inside the respective cavity 220, contacting two electrically isolated buried electrically conductive structures (not shown), which may be electrically isolated from each other. These embodiments may be provided for junction isolated technologies as well as for SOI technologies.

In various embodiments, one or more controllers may be integrated (in other words embedded) in the substrate 202. The one or rare controllers may be configured to control the one or more driver circuits. An electrically conductive connecting structure may also be provided at the first side 204 of the substrate 202 and electrically connected to the plurality of driver circuits, wherein the electrically conductive connecting structure may be electrically coupleable to from the first side 204 of the substrate 202.

FIG. 3A shows a cross sectional view 300 of a portion of a substrate 302, e.g. a driver substrate 302, and a portion of an LED sub-matrix 304 in accordance with various embodiments. Furthermore, FIG. 3B shows a circuit diagram 350 of a circuit including an LED and a driver circuit as implemented by a portion as shown in FIG. 3A. As shown in FIG. 3A, in various embodiments, the substrate 302 may include a plurality of component regions, e.g. a plurality of first component regions 306 and a plurality of second component regions 308. Exactly one first component region 306 and exactly one second component region 308 may form a component region unit, wherein each component region unit may be associated with exactly one LED 310 of the LED sub-matrix 304 to drive the associated LED 310. The first component regions 306 and the second component regions 308 may be arranged alternatingly next to each other within the substrate 302. The component regions 306, 308 may be electrically isolated from each other by means of isolating trenches 344, e.g. filled with oxide (e.g. silicon oxide) or with oxide (e.g. silicon oxide) and polysilicon. In case the isolating trenches 344 are filled with oxide (e.g. silicon oxide) and polysilicon, the bottom of that structure may in turn be isolated by means of an oxide (e.g. silicon oxide) 348.

Each first component region 306 may include at least one transistor 312, e.g. a vertical transistor 312, e.g. a vertical power transistor 312, e.g. a bipolar transistor 312, e.g. a pnp bipolar transistor 312 having a base region 314 (which may be n-doped), an emitter region 316 (which may be p-doped), and a collector region 318 (which may be p-doped). As shown in FIG. 3A, the pnp bipolar transistor 312 may be a vertical transistor, i.e. a transistor providing a current flow from an upper surface of the substrate 302 through the entire substrate 302 to a lower surface of the substrate 302 opposite the upper surface of the substrate 302, as symbolized in FIG. 3A by means of a fourth arrow 320.

Furthermore, each second component region 308 may include a logic circuit, e.g. a regulator circuit to control the transistor 312 in the first component region 306. In general, each second component region 308 may include any kind of control logic depending on the desired driving characteristics. In a very simple implementation, each second component region 308 may include a differential amplifier 322, a first resistor 324 and a second resistor 326, which may be coupled to a regulator circuit to control the current flow through the transistor 312 of the associated and coupled first each component region 306. In more detail, an output of the differential amplifier 322 may be coupled to the base region 314 of the transistor 312, e.g. via conductor tracks provided over the upper surface of the component regions 306, 308 (not shown). Furthermore, a first input of the differential amplifier 322 may be coupled to a first terminal of the first resistor 324, a second terminal of which may be coupled to a second terminal of the second resistor 326, wherein a first terminal of the second resistor 326 may be coupled to a second input of the differential amplifier 322. Furthermore, the emitter region 316 of the transistor 312 may be coupled to the second terminal of the second resistor 326 and the collector region of the transistor 312 may be coupled to an anode 328 of the LED 310. A cathode 330 of the LED 310 may be coupled to a reference voltage 332 such as e.g. ground 332. Moreover, the differential amplifier 322 may be coupled to a current source 334 and via the same with the reference voltage 332 such as e.g. ground 332. As shown in FIG. 3A, the anode 328 of the LED 310 is connected to the collector region 318 of the transistor 312 via an anode contact 336 of the LED 310 and a first substrate contact 338 of the substrate 302. Further, the cathode 330 of the LED 310 is connected to the reference voltage 332 such as ground 332 via a cathode contact 340 of the LED 310 and via a second substrate contact 342 of the substrate 302. Thus, a current flow may be provided from the LED 310 via the cathode contact 340 of the LED 310 into the second substrate contact 342 of the substrate 302, into the substrate 302, as symbolized in FIG. 3A by means of a fifth arrow 346.

The reference voltage 332 may be provided via a portion of the substrate 302 of the second component region 308.

Thus, illustratively, a driver switch may be provided in the first component region 306 and the regulating circuit to regulate the driver switch (and thus the current to flow through the driver switch) may be provided in the second component region 308, which allows a simple implementation of very different characteristics of electrical components, e.g. one or more power devices (in the first component region 306) and logic devices (in the second component region 308). Furthermore, these embodiments provide a very space saving arrangement of the components and a very simple and cost efficient interconnection between the electronic components of the driver circuit, for example, and the LEDs 310. Also the assembling of these components becomes very simple.

In these embodiments, the substrate 302 may be an SOI substrate 302. Illustratively, in various embodiments, an as such standard CMOS process in the p-doped substrate 302 may be provided to form the isolating trenches 344 to electrically isolate the component regions 306, 308 from each other. In these embodiments, the vertical pnp transistor 312 is used to source the current to the LED 310, while the adjacent CMOS control circuit (also referred to as regulating circuit above) controls the pass device, in other words, the vertical pnp transistor 312. In these embodiments, as such standard pad metallization may be provided on the top of the components, and the metallization on the substrate 302 side to provide the contact to the LED 310. Also here, the cathode contact 340 may be implemented, if this simplifies the LED 310 design.

FIG. 4A shows a cross sectional view 400 of a portion of a substrate 402, e.g. a driver substrate 402, and a portion of an LED sub-matrix 404 in accordance with various embodiments. Furthermore, FIG. 4B shows a circuit diagram 450 of a circuit including an LED and a driver circuit as implemented by a portion as shown in FIG. 4A.

A main difference between the embodiments as shown in FIG. 4A and the embodiments as shown in FIG. 4B may be seen in that the substrate 402 is an n-doped substrate 402, whereas the substrate 302 of the embodiments as shown in FIG. 3A is a p-doped substrate 302. Based on this difference, the respective circuits are also inverted in doping and the respective connections are adapted accordingly.

In more detail, as shown in FIG. 4A, in various embodiments, the substrate 402 may include a plurality of component regions, e.g. a plurality of first component regions 406 and a plurality of second component regions 408. Exactly one first component region 406 and exactly one second component region 408 may form a component region unit, wherein each component region unit may be associated with exactly one LED 410 of the LED sub-matrix 404 to drive the associated. LED 410. The first component regions 406 and the second component regions 408 may be arranged alternatingly next to each other within the substrate 402. The component regions 406, 408 may be electrically isolated from each other by means of isolating trenches 444.

Each first component region 406 may include at least one transistor 412, e.g. a vertical transistor 412, e.g. a vertical power transistor 412, e.g. a bipolar transistor 412, e.g. a npn bipolar transistor 412 having a base region 414 (which may be p-doped), an emitter region 416 (which may be n-doped), and a collector region 418 (which may be n-doped). As shown in FIG. 4A, the npn bipolar transistor 412 may be a vertical transistor, i.e. a transistor providing a current flow from an upper surface of the substrate 402 through the entire substrate 402 to a lower surface of the substrate 402 opposite the upper surface of the substrate 402.

Furthermore, each second component region 408 may include a logic circuit, e.g. a regulator circuit to control the transistor 412 in the first component region 406. In general, each second component region 408 may include any kind of control logic depending on the desired driving characteristics. In a very simple implementation, each second component region 408 may include a differential amplifier 420, a first resistor 422 and a second resistor 424, which may be coupled to a regulator circuit to control the current flow through the transistor 412 of the associated and coupled first each component region 406.

In more detail, an output of the differential amplifier 420 may be coupled to the base region 414 of the transistor 412, e.g. via conductor tracks provided over the upper surface of the component regions 406, 408 (not shown). Furthermore, a first input of the differential amplifier 420 may be coupled to a first terminal of the first resistor 422, a second terminal of which may be coupled to a second terminal of the second resistor 424 and to a reference voltage 426 such as ground. A first terminal of the second resistor 424 may be coupled to a second input of the differential amplifier 420. Furthermore, the emitter region 416 of the transistor 412 may be coupled to the first terminal of the second resistor 424 and the collector region 418 of the transistor 412 may be coupled to a cathode 428 of the LED 410. An anode 430 of the LED 410 may be coupled to a supply voltage terminal 432 (wherein the supply voltage may be a positive voltage). Moreover, the differential amplifier 420 may be coupled to a current source 434 and via the same with the supply voltage. As shown in FIG. 4A, the cathode 428 of the LED 410 is connected to the collector region 418 of the transistor 412 via a cathode contact 436 of the LED 410 and a first substrate contact 438 of the substrate 402. Further, the anode 430 of the LED 410 is connected to the supply voltage via an anode contact 440 of the LED 410 and via a second substrate contact 442 of the substrate 402 (it is to be noted that these contacts 440, 442 are optional).

Thus, illustratively, a driver switch may be provided in the first component region 406 and the regulating circuit to regulate the driver switch may be provided in the second component region 408, which allows a simple implementation of very different characteristics of electrical components, e.g. one or more power devices (in the first component region 406) and logic devices (in the second component region 408). Furthermore, these embodiments provide a very space saving arrangement of the components and a very simple and cost efficient interconnection between the electronic components of the driver circuit, for example, and the LEDs 410. Also the assembling of these components becomes very simple.

In these embodiments, the substrate 402 may be an SOI substrate 402. Illustratively, in various embodiments, an as such standard CMOS process in the p-doped substrate 402 may be provided to form the isolating trenches 444 to electrically isolate the component regions 406, 408 from each other. In these embodiments, the vertical npn transistor 412 is used to source the current to the LED 410, while the adjacent CMOS control circuit (also referred to as regulating circuit above) controls the pass device, in other words, the vertical npn transistor 412. In these embodiments, as such standard pad metallization may be provided on the top of the components, and the metallization on the substrate 402 side to provide the contact to the LED 410. Also here, the cathode contact 440 may be implemented, if this simplifies the LED 410 design.

FIG. 5 shows an enlarged cross sectional view 500 of a portion of the driver substrate 302 as shown in FIG. 3A.

As shown in FIG. 5, one possible realization of these embodiments may be to use a so-called thin wafer technology, starting with a substrate (e.g. p-substrate) 302, 402 and a deep trench isolation (DTI) 344 of e.g. about 50 μm depth (with an oxide (e.g. silicon oxide) fill only or oxide side walls with poly silicon fill). After processing the frontside 560 (isolation (e.g. 344), wells (e.g. 502, 504, 506, 508), contact implants (e.g. 510, 512, 514, 516, 518, 520, 522) and frontside metallization (e.g. 524, 526, 528, 530, 532, 534, 536, 538) within isolating material (e.g. 540) such as an oxide (e.g. silicon oxide)) the wafer substrate 302, 402 may be put on a glass carrier system and grinded up to the DTI 344 and an oxide 542 may be deposited on the backside 562, and the oxide 542 may be structured. After that, a metallization layer may be processed and structured. This metallization layer may form a pad 342 for the voltage supply of the circuits or components, but may also act as an interconnect surface 338 to the respective LED 310, 410, which may be placed on top and may be driven electrically e.g. by a vertical (pnp or npn) transistor 312, 412.

FIG. 6 shows an LED sub-matrix 102, 304 and a corresponding portion of a driver substrate 302, 402, in accordance with various embodiments, wherein the LED sub-matrix 102, 304 and the driver substrate 302, 402 are put together in an aligned manner. In various embodiments, the size of the LED sub-matrix 102, 304 may be optimized taking in consideration yield and testability thereof.

The interconnection between the LED 310 and the driver substrate 302, 402 was discussed above and in the following, the connection of the driver substrate 302, 402 with a lattice will be presented with reference to FIG. 7.

FIG. 7 shows an assembly 700 including a plurality of LED sub-matrices 102, 304 and corresponding portions of the driver substrates 302, 402 as shown in FIG. 6 being mounted on a carrier 702 in accordance with various embodiments.

As shown in FIG. 7, the plurality of LED sub-matrices 102, 304 and corresponding portions of the driver substrates 302, 402 may be mounted on the carrier 702. The carrier 702 may include a lattice which may be made out of printed circuit board (PCB) material or ceramic and/or semiconductor material and the like. The carrier may include a plurality of conductor tracks 704 and contacting pads 706 electrically conductively coupled with the plurality of conductor tracks 704 and, via the same, with the driver substrates 302, 402. Furthermore, one or more chips 708, 710 may be provided to be electrically coupled with the contacting pads 706, e.g. via wire bonds (not shown). The chips 708, 710 may by configured as a controller (e.g. a microcontroller and/or a digital signal processor (DSP)) and/or as a power supply such as e.g. an AC/DC converter or DC/DC converter (e.g. a DC/DC buck converter) which may be configured to convert an input voltage to a voltage needed to supply the whole LED matrix 100 or portions of the LED matrix 100 (e.g. one or more LED sub-matrices 102), for example. In various embodiments, the controller may be configured to impose to each LED 310 the wanted modulation parameter(s). The modulation parameter(s) may be duty cycle, pulse density, $t_{on}$ (time period during which the LED is activated), $t_{off}$ (time period during which the LED is deactivated), average current, and the like, for example.

FIG. 8 shows a flow diagram illustrating a method 800 of manufacturing a device.

The method 800 may include, in 802, providing a substrate having a first side and a second side opposite the first side, in 804, forming a plurality of driver circuits at the first side of the substrate, wherein each of the plurality of driver circuits is configured to drive a current from the first side of the substrate to the second side of the substrate, and, in 806, forming at least one load interface at the second side of the substrate, wherein the at least one load interface is configured to couple the current from the plurality of the driver circuits to a plurality of loads at the second side of the substrate.

FIG. 9 shows a flow diagram illustrating a method 900. The method 900 includes, in 902, driving, by a plurality of driver circuits embedded in a first side of a substrate, an electric current from the first side of a substrate to a second side of the substrate opposite the first side of the substrate, and, in 904, electrically coupling, via at least one load interface at the second side of the substrate, the electric current from the plurality of driver circuits to a plurality of loads at the second side of the substrate.

In various embodiments, illustratively, a semiconductor technology is provided, which implements the LED pixel driver where:
  N×M isolated independent LED Drivers may be monolithically integrated on the same die, e.g. the same semiconductor die (with N and M being arbitrary integer values);

Example 1

Bulk micromachining on as such standard junction isolated semiconductor technology (as described e.g. with reference to FIG. 2A to FIG. 2D);

Example 2

Flipped SOI like technology or flipped SOI on trench isolated technologies (as described e.g. with reference to FIG. 3A and FIG. 4A).

In various embodiments, the controlled LED current flows vertically from the driver to the LED through the substrate.

Interconnection may be made possible on both sides of the semiconductor die, e.g. by means of ball grid array (BGA) technology.

A lattice technology that contains the routing necessary to access each single LED and contains the pads to host the LED pixel drivers and other electronic components is provided in various embodiments. Examples for an implementation of a lattice are an FR4 substrate or a ceramic substrate or a raw silicon substrate where just the metallization complex is implemented.

In various embodiments, a sandwich construction is provided e.g. with the following sub-structures, starting from the top of the sandwich construction:
  N×M LED Sub-Matrix:
    The single LED Pixel should have at least one electrode on the bottom side to realize the interconnection with the subsequent layer.
  N×M LED Sub-Driver.
    The drivers are placed with the substrate on top (e.g. on the first side 204 of the substrate 202). Each driver should be contacted with the co-respective LED pixel. The bottom side hosting the circuits and one side of the pass device, may have interconnection pads realizing the interconnection with the last layer of the sandwich construction.

In various embodiments, a device is provided. The device may include a substrate having a first side and a second side opposite the first side, the substrate including a plurality of driver circuits at the first side of the substrate, wherein each of the plurality of driver circuits is configured to drive a current from the first side of the substrate to the second side of the substrate; and at least one load interface at the second side of the substrate, wherein the at least one load interface is configured to couple the current from the plurality of the driver circuits to a plurality of loads at the second side of the substrate.

In various embodiments, the plurality of driver circuits may be embedded within the substrate at the first side of the substrate. Furthermore, the at least one load interface may be embedded within the substrate at the second side of the substrate. The plurality of loads may be embedded within the second side of the substrate via the at least one load interface. The at least one load interface may include a plurality of recesses at the second side of the substrate; wherein each of the plurality of recesses may be configured to receive at least one of a plurality of loads. In various embodiments, at least one load of the plurality of loads includes a light emitting diode. The plurality of loads may include a matrix of light emitting diodes. The plurality of driver circuits may be electrically isolated from each other in a lateral direction across the first surface of the substrate, e.g by means of isolating trenches provided in the substrate. The plurality of driver circuits may be electrically isolated from each other in the substrate by at least one trench. The at least one trench may extend through the substrate from the first side of the substrate to the second side of the substrate. In various embodiments, the substrate may include a semiconductor die. At least one of the plurality of driver circuits may include a vertical transistor. The device may further include at least one controller integrated in the substrate to control the plurality of driver circuits. The at least one controller may include a plurality of controllers integrated in the substrate, wherein each controller may be configured to control at least one driver circuit of the plurality of driver circuits. The device may further include an electrically conductive connecting structure at the first side of the substrate and electrically connected to the plurality of driver circuits, wherein the electrically conductive connecting structure may be electrically coupleable to from the first side of the substrate. The electrically conductive connecting structure may include a plurality of contact pads at the first side of the substrate. In various embodiments, the substrate includes at least a first semiconductor die and a second semiconductor die; and the plurality of driver circuits may be embedded within the first semiconductor die; and the at least one load interface may be embedded within the second semiconductor die. The first semiconductor die may include a first side and a second side; and the plurality of driver circuits may be embedded within the first side of the first semiconductor die; the second semiconductor die may have a first side and a second side, and the at least one load interface may be embedded within the second side of the second semiconductor die; and the plurality of driver circuits may be electrically coupled to the at least one load interface via at least one electrical conductor between the second side of the first semiconductor die and the first side of the second semiconductor die. The at least one load may be configured to be coupled to by a test module, wherein the test module is configured to test at least one of the plurality of loads via the at least one load interface based on the current coupled from the plurality of drive circuits to the plurality of loads at the second side of the substrate. The plurality of loads may include a plurality of LED elements, and the test module may be configured to test the plurality of LED elements via the at least one load interface. Furthermore, the test module may be configured to test the plurality of LED elements to determine whether the LED elements are functioning. In various embodiments, the test module may be configured to test the plurality of LED elements to determine the light intensity of the light emitted by the respective LED elements. Furthermore, the test module may be configured to test the plurality of LED elements to determine the luminous color of the light emitted by the respective LED elements. Moreover, the test module may be configured to test the plurality of LED elements to determine the luminous flux of the light emitted by the respective LED elements. Alternatively or in addition, the test module may be configured to test the plurality of LED elements to determine the directivity of the light emitted by the respective LED elements. Alternatively or in addition, the test module may be configured to test the plurality of LED elements to determine the power consumption of the respective LED elements.

In various embodiments, a method of manufacturing a circuit arrangement is provided. The method may include:

forming a plurality of driver circuits at a first side of a substrate, wherein each of the plurality of driver circuits is configured to drive a current from the first side of the substrate to a second side of the substrate opposite the first side of the substrate; and forming at least one load interface at the second side of the substrate, wherein the at least one load interface is configured to couple the current from the plurality of the driver circuits to a plurality of loads at the second side of the substrate.

In various embodiments, the plurality of driver circuits may be embedded within the substrate at the first side of the substrate. The at least one load interface may be embedded within the substrate at the second side of the substrate. Furthermore, the plurality of loads may be embedded within the second side of the substrate via the at least one load interface. In various embodiments, forming at least one load interface may include forming a plurality of recesses at the second side of the substrate; wherein each of the plurality of recesses may be configured to receive at least one of a plurality of loads. At least one load of the plurality of loads may include a light emitting diode. The plurality of loads may include a matrix of light emitting diodes. The plurality of driver circuits may be electrically isolated from each other in a lateral direction across the first surface of the substrate. The method may further include forming at least one trench in the substrate to electrically isolate the plurality of driver circuits from each other in the substrate. The at least one trench may be formed to extend through the substrate from the first side of the substrate to the second side of the substrate. The substrate may include a semiconductor die. In various embodiments, at least one of the plurality of driver circuits may include a vertical transistor. The method may further include forming at least one controller integrated in the substrate to control the plurality of driver circuits. Moreover, forming the at least one controller may include forming a plurality of controllers integrated in the substrate, wherein each controller may be configured to control at least one driver circuit of the plurality of driver circuits. Furthermore, the method may further include forming an electrically conductive connecting structure at the first side of the substrate and electrically connected to the plurality of driver circuits, wherein the electrically conductive connecting structure may be electrically coupleable to from the first side of the substrate. The electrically conductive connecting structure may include a plurality of contact pads at the first side of the substrate. The substrate may include at least a first semiconductor die and a second semiconductor die; and wherein the plurality of driver circuits may be embedded within the first semiconductor die; and the at least one load interface may be embedded within the second semiconductor die. The first semiconductor die may include a first side and a second side; and the plurality of driver circuits may be embedded within the first side of the first semiconductor die; the second semiconductor die may have a first side and a second side, and wherein the at least one load interface is embedded within the second side of the second semiconductor die; and the plurality of driver circuits may be electrically coupled to the at least one load interface via at least one electrical conductor between the second side of the first semiconductor die and the first side of the second semiconductor die.

In various embodiments, a method is provided. The method includes driving, by a plurality of driver circuits embedded in a first side of a substrate, an electric current from the first side of a substrate to a second side of the substrate opposite the first side of the substrate, and electrically coupling, via at least one load interface at the second side of the substrate, the electric current from the plurality of driver circuits to a plurality of loads at the second side of the substrate.

In various embodiments, driving the electric current from the first side of the substrate to the second side of the substrate may include driving the current using a plurality of driver circuits arranged at the first side of the substrate. In various embodiments, at least one load of the plurality of loads may include a light emitting diode. In various embodiments, the plurality of driver circuits may be electrically isolated from each other in a lateral direction across the first surface of the substrate. The method may further include testing the plurality of loads based on the driven electrical current. In various embodiments, the testing the plurality of loads may include testing the functionality of the plurality of loads. In various embodiments, the testing the functionality of the plurality of loads may include testing at least one of the following parameters: light intensity of light emitted by a respective load, luminous color of light emitted by a respective load, luminous flux of light emitted by a respective load, directivity of light emitted by a respective load, and/or power consumption of a respective load.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A device, comprising:
   a substrate having a first side and a second side opposite the first side, the substrate comprising a plurality of driver circuits at the first side of the substrate, wherein each of the plurality of driver circuits is configured to drive a current from the first side of the substrate to the second side of the substrate; and
   at least one load interface at the second side of the substrate, wherein the at least one load interface is configured to couple the current from the plurality of the driver circuits to a plurality of loads at the second side of the substrate.

2. The device of claim 1,
   wherein the at least one load is configured to be coupled to by a test module, wherein the test module is configured to test at least one of the plurality of loads via the at least one load interface based on the current coupled from the plurality of drive circuits to the plurality of loads at the second side of the substrate.

3. The device of claim 2,
   wherein the plurality of loads comprise a plurality of LED elements, and
   wherein the test module is configured to test the plurality of LED elements via the at least one load interface.

4. The device of claim 2,
   wherein the test module is configured to test the plurality of LED elements to determine the function of the LED elements.

5. The device of claim 1,
   wherein the plurality of driver circuits are embedded within the substrate at the first side of the substrate.

6. The device of claim 1,
   wherein the at least one load interface is embedded within the substrate at the second side of the substrate.

7. The device of claim 1,
wherein the plurality of loads are embedded within the second side of the substrate via the at least one load interface.

8. The device of claim 7,
wherein the at least one load interface comprises a plurality of recesses at the second side of the substrate;
wherein each of the plurality of recesses is configured to receive at least one of a plurality of loads.

9. The device of claim 1,
wherein at least one load of the plurality of loads comprises a light emitting diode.

10. The device arrangement of claim 1,
wherein the plurality of driver circuits are electrically isolated from each other in a lateral direction across the first surface of the substrate.

11. The device arrangement of claim 10,
wherein the plurality of driver circuits are electrically isolated from each other in the substrate by at least one trench.

12. The device of claim 1,
wherein at least one of the plurality of driver circuits comprises a vertical transistor.

13. The device of claim 1, further comprising:
at least one controller integrated in the substrate to control the plurality of driver circuits.

14. A method of manufacturing a device, the method comprising:
forming a plurality of driver circuits at a first side of a substrate, wherein each of the plurality of driver circuits is configured to drive a current from a first side of the substrate to a second side of the substrate opposite the first side of the substrate; and
forming at least one load interface at the second side of the substrate, wherein the at least one load interface is configured to couple the current from the plurality of the driver circuits to a plurality of loads at the second side of the substrate.

15. A method, comprising:
driving, by a plurality of driver circuits embedded in a first side of a substrate, an electric current from the first side of a substrate to a second side of the substrate opposite the first side of the substrate;
electrically coupling, via at least one load interface at the second side of the substrate, the electric current from the plurality of driver circuits to a plurality of loads at the second side of the substrate.

16. The method of claim 15,
wherein at least one load of the plurality of loads comprises a light emitting diode.

17. The method of claim 15,
wherein the plurality of driver circuits are electrically isolated from each other in a lateral direction across the first surface of the substrate.

18. The method of claim 15, further comprising:
testing the plurality of loads based on the driven electrical current.

19. The method of claim 18,
wherein testing the functionality of the plurality of loads comprises testing at least one of the following parameters:
light intensity of light emitted by a respective load;
luminous color of light emitted by a respective load;
luminous flux of light emitted by a respective load;
directivity of light emitted by a respective load;
power consumption of a respective load.

* * * * *